(12) United States Patent
Chen et al.

(10) Patent No.: US 11,877,424 B2
(45) Date of Patent: Jan. 16, 2024

(54) COLD PLATE FOR COOLING ELECTRONIC COMPONENT

(71) Applicant: Quanta Computer Inc., Taoyuan (TW)

(72) Inventors: Chao-Jung Chen, Taoyuan (TW); Yu-Nien Huang, Taoyuan (TW); Herman Tan, Taoyuan (TW); Tien-Juei Chuang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 51 days.

(21) Appl. No.: 17/825,433

(22) Filed: May 26, 2022

(65) Prior Publication Data

US 2023/0345672 A1  Oct. 26, 2023

Related U.S. Application Data

(60) Provisional application No. 63/333,379, filed on Apr. 21, 2022.

(51) Int. Cl.
*H05K 7/20* (2006.01)

(52) U.S. Cl.
CPC ..... *H05K 7/20336* (2013.01); *H05K 7/20509* (2013.01)

(58) Field of Classification Search
CPC ........................ H05K 7/20336; H05K 7/20509
See application file for complete search history.

(56) References Cited

U.S. PATENT DOCUMENTS

| 7,770,630 B2 | 8/2010 | Chesser et al. | |
| 2012/0137718 A1* | 6/2012 | Uchida | H05K 7/20336 |
| | | | 62/434 |
| 2023/0225082 A1* | 7/2023 | Zhang | H05K 7/20309 |
| | | | 361/700 |

FOREIGN PATENT DOCUMENTS

| TW | M500919 U | | 5/2015 | |
| WO | 2022/115050 | * | 6/2022 | F28D 15/04 |

OTHER PUBLICATIONS

TW Office Action for Application No. 111132454, dated Mar. 6, 2023, w/ First Office Action Summary.
TW Search Report for Application No. 111132454, dated Mar. 6, 2023, w/ First Office Action.

* cited by examiner

*Primary Examiner* — Mukundbhai G Patel
(74) *Attorney, Agent, or Firm* — NIXON PEABODY LLP (57) ABSTRACT

A cold plate for cooling an electronic component is disclosed. The cold plate includes a base portion having a fluid channel with a fluid inlet and a fluid outlet, the fluid channel being configured to internally circulate a cooling fluid for carrying heat dissipated by the electrical component; and a cover coupled to the base portion such that the fluid channel is enclosed internally in the cold plate. The cover has a vapor outlet formed on a top side of the cover, the vapor outlet allowing generated vapor to exit from within the cold plate. Also disclosed is a method for cooling the electronic component via the cold plate. The method includes allowing some fluid of the circulating cooling fluid to seep from the fluid channel into an internal chamber, and allowing vapor to be expelled through the vapor outlet.

16 Claims, 5 Drawing Sheets

COLD PLATE FOR COOLING ELECTRONIC COMPONENT

CROSS-REFERENCE TO RELATED APPLICATIONS

This application claims priority from and benefit of U.S. Provisional Patent Application Ser. No. 63/333,379, filed on Apr. 21, 2022, titled "Anti DNB Phase Changing Cold Plate," which is hereby incorporated by reference herein in its entirety.

FIELD OF THE INVENTION

The present invention relates generally to a cold plate, and more specifically, to a cold plate designed to overcome performance degradation caused by departure from nucleate boiling (DNB) phase changing.

BACKGROUND OF THE INVENTION

Telecommunication devices, such as 5G equipment, base stations for cellular networks and servers, typically generate heat. When cooling such high-powered devices, air cooling is often inadequate and liquid cooling may be required. Cold plates provide localized cooling by transferring heat from a device to a liquid that flows to a remote heat exchanger and dissipates into either the ambient or to another liquid in a secondary cooling system. Typically, a cold plate directly contacts the heat source to dissipate heat by thermal conduction such that the heat is released to a surrounding system/environment through thermal convection.

In general, thermal conductivity of a cold plate mostly depends on its material, while the efficiency of its thermal convection is highly dependent on its interaction with surrounding fluid. The most common way of thermal convection is to increase the area of contact with fluid, for example, fin parts. However, such method is only suitable for single phase cooling either by air or by liquid.

Figure 1A:
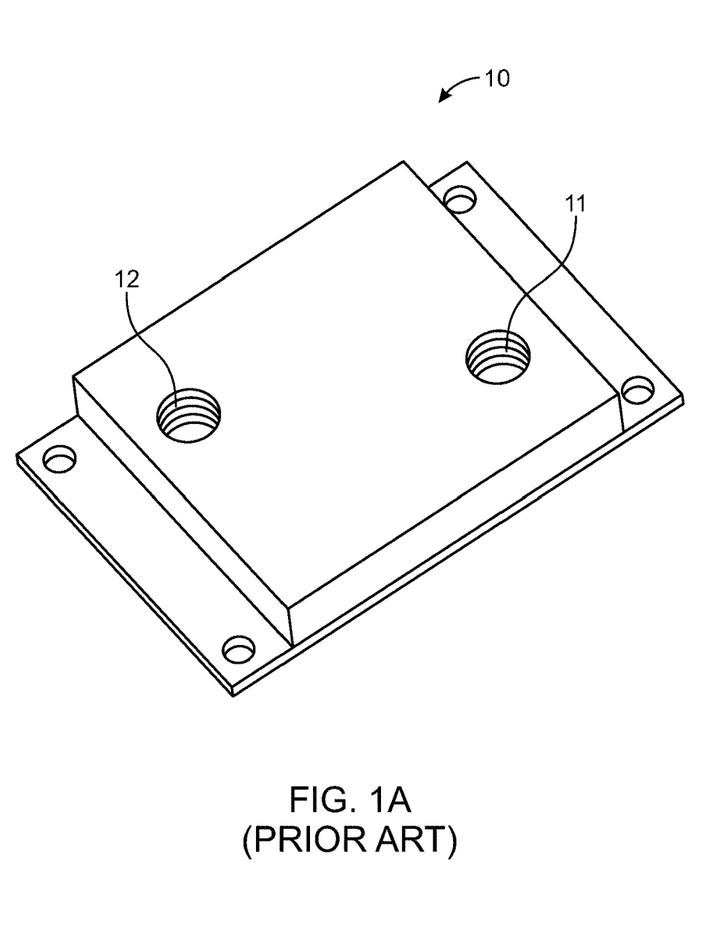
FIG. 1A shows an exterior structure of a prior art cold plate and FIG. 1B shows an interior structure of the prior art cold plate.
Figure 1B:
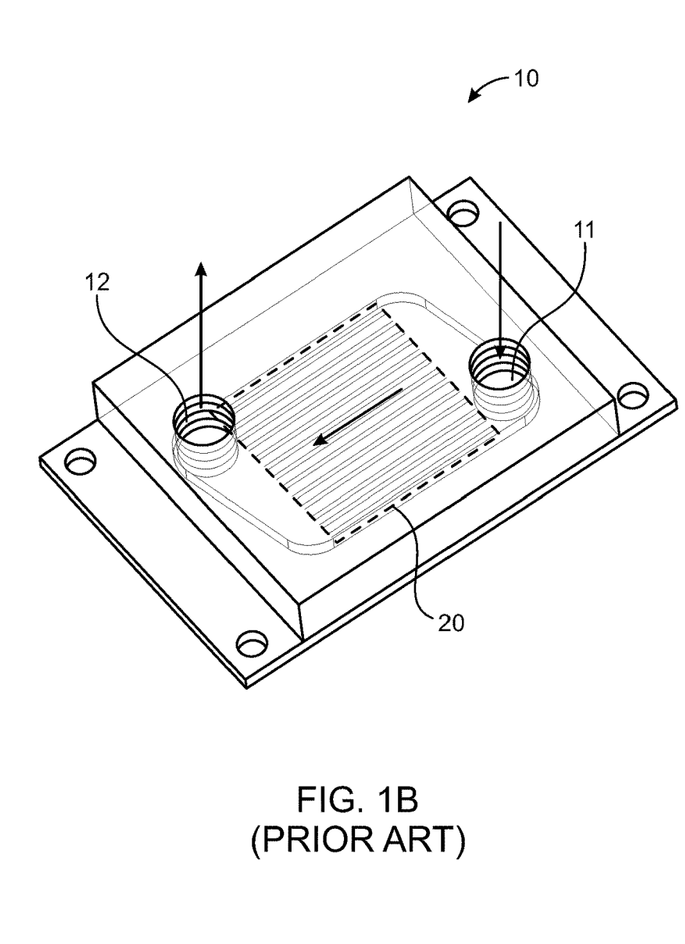

FIGS. 1A and 1B show a prior art cold plate 10 for a central processing unit (CPU) component. Referring to FIGS. 1A and 1B, typically a cold plate 10 is provided with two channels, an inlet channel 11 and an outlet channel 12. As shown in FIGS. 1A and 1B, typically heat source, such as CPUs, is coupled to the bottom side of the cold plate 10. For example, corrugated fins 20 provided on the heat source contact the internal surface of the cold plate 10. While increasing the contact area is important for a cold plate for phase changing medium, the cold plate should be designed to initiate and enhance fluid phase changing. Yet, most cold plates are implemented by adding a surface treatment to enhance the phase changing/boiling effect.

In real application, heat flux may vary and sometimes it can exceed critical heat flux, causing a boiling crisis such as departure from nucleate boiling (DNB). DNB can deteriorate cold plate heat transfer capability due to massive air bubble that is generated at once and cannot be extracted immediately.

Therefore, a need exists for an improved cold plate that can overcome performance degradation caused by DNB in phase changing cold plates. The present disclosure is directed to such a cold plate that provides a vapor outlet for expelling vapor generated within the cold plate.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cold plate for cooling an electronic component is disclosed. The cold plate for cooling an electronic component includes a base portion having a fluid channel with a fluid inlet and a fluid outlet, the fluid channel being configured to internally circulate a cooling fluid for carrying heat dissipated by the electrical component; and a cover coupled to the base portion such that the fluid channel is enclosed internally in the cold plate, the cover having a vapor outlet formed on a top side of the cover, the vapor outlet allowing generated vapor to exit from within the cold plate.

In some embodiments, the base portion is defined by a peripheral wall, the fluid channel being located adjacent to the peripheral wall. For example, the peripheral wall has a plurality of sides, including a front side, a back side, a left side, and a right side.

In some embodiments, the base portion further includes a chamber, the fluid channel being located between the peripheral wall and the chamber. In some embodiments, the fluid channel completely surrounds the chamber. In some embodiments, the fluid channel is separated from the chamber via a controlled gap.

In some embodiments, the cold plate further includes a control material located in the controlled gap, the cooling fluid seeping through the control material from the fluid channel to the chamber. The control material may be any materials with a micro-structure that creates sufficient capillary force. For example, the control material is one or more of a wick material or a powder material.

According to certain aspects of the present disclosure, a cold plate for cooling an electronic component includes a first member defined by a first wall; a second member mechanically coupled to the first member, the second member being defined by a second wall and a third wall, a fluid channel formed between the second wall and the third wall, the fluid channel being configured to internally circulate a cooling fluid for carrying heat dissipated by the electrical component; a fluid inlet and a fluid outlet formed at the fluid channel, the fluid inlet formed at one end of the fluid channel for allowing the cooling fluid to enter the fluid channel, the fluid outlet formed at another end of the fluid channel for allowing the cooling fluid to exit the fluid channel; and a vapor outlet formed on a top side of the first member, the vapor outlet allowing generated vapor to exit from within the cold plate.

In some embodiments, the cold plate further includes a chamber defined by the third wall. In some embodiments, a surface of the chamber is covered with a layer of one or more of material(s) with a micro-structure that creates sufficient capillary force. For example, the material with a micro-structure is a wick material or a powder material. In some embodiments, the fluid channel is separated from the chamber via a controlled gap, the controlled gap allowing the cooling fluid to seep through the one or more of the material with a micro-structure, the cooling fluid seeping from the fluid channel into the chamber.

In some embodiments, a height of the controlled gap is less than a height of the layer of one or more of the material with a micro-structure such that the layer is always in a wet condition. In some embodiments, a portion of the cooling fluid vaporized from the chamber, and exiting from the cold plate, is replaced with a portion of the cooling fluid provided from the fluid channel by the seeping.

In some embodiments, the second member is detachably coupled to the first member. In some embodiments, the vapor outlet extends from the top side of the first member. In some embodiments, an entire surface of a bottom side of the first member is flat.

According to certain aspects of the present disclosure, a method for cooling an electronic component via a cold plate is disclosed. The method for cooling an electronic component via a cold plate includes circulating a cooling fluid in a fluid channel of the cold plate, the fluid channel surrounding a peripheral surface of the cold plate; allowing some fluid of the cooling fluid to seep from the fluid channel into an internal chamber, the seeping being achieved through a control material located in a gap between the fluid channel and the internal chamber; and causing vapor to be expelled through a dedicated vapor outlet located in a top surface of the cold plate, the vapor being generated by heat from the electronic component coupled to the cold plate.

In some embodiments, the method further includes maintaining the control material located in the internal chamber in a wet state, the wet state allowing vaporized cooling fluid to be supplemented with seeped cooling fluid. In some embodiments, the cooling fluid within the internal chamber is maintained at a substantially constant level.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure relates to a cold plate for cooling an electronic component. The cold plate is provided with a chamber covered with a layer of one or more of a material with a micro-structure that creates sufficient capillary force such that a cooling fluid seeps through the layer from a fluid channel to the chamber. The cold plate is also provided with a vapor outlet allowing vapor generated from the chamber to exit, thus overcoming performance degradation that can be caused by DNB in the phase changing cold plate.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
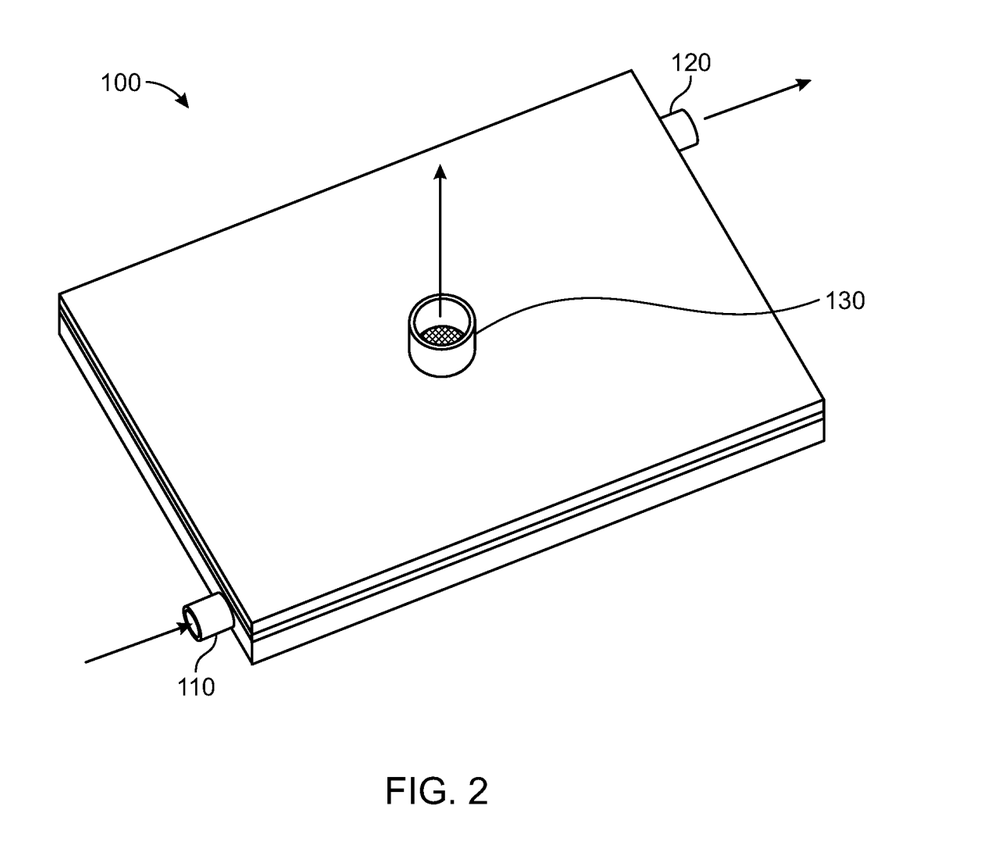
FIG. 2 is a generally perspective view of a cold plate, according to certain aspects of the present disclosure.

Referring to FIG. 2, a cold plate 100, according to an embodiment of the present disclosure, has fluid inlet 110, fluid outlet 120, and vapor outlet 130. In some embodiments, at least one or all of the fluid inlet 110, fluid outlet 120, and vapor outlet 130 are formed externally. In particular, the vapor outlet 130 is located at the top of the cold plate 100. For example, as shown in FIG. 2, the fluid inlet 110 and fluid outlet 120 are formed in the horizontal direction while the vapor outlet 130 is formed in the vertical direction. However, the directions in which the fluid inlet 110, fluid outlet 120, and vapor outlet 130 are formed are not limited thereto. For example, all inlet(s)/outlet(s) 110, 120, 130 may be formed in the same direction, vertically or horizontally.

Figure 3A:
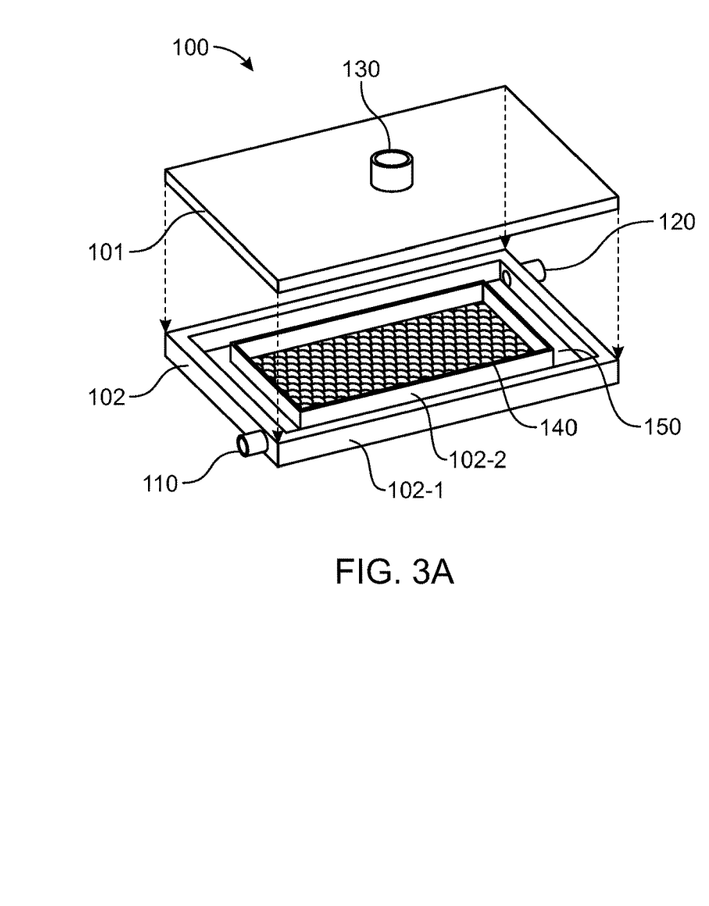
FIG. 3A is an exploded perspective view of a cold plate, according to certain aspects of the present disclosure.
Figure 3B:
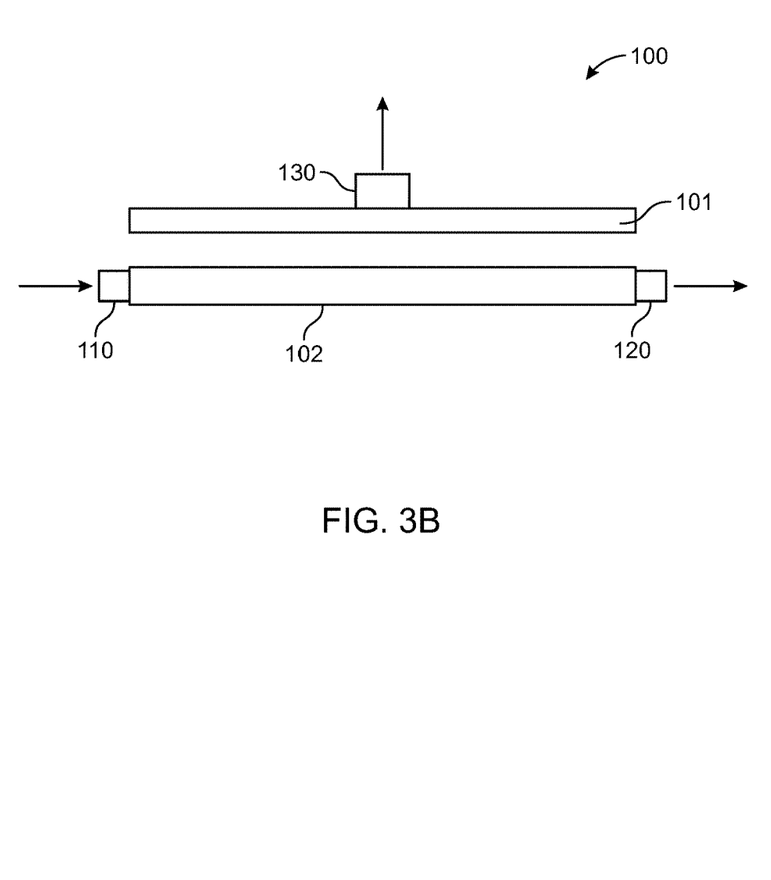
FIG. 3B is a side view of the cold plate shown in FIG. 3A.

Referring to FIGS. 3A and 3B, according to various embodiments of the present disclosure, the cold plate 100 includes a cover 101 and a base portion 102. In some embodiments, the vapor outlet 130 is located on the top side of the cover 101. The base portion 102 has a fluid channel 150 with a fluid inlet 110 at one end and a fluid outlet 120 at another end. The fluid inlet 110 allows the cooling fluid to enter the fluid channel 150 and the fluid outlet 120 allows the cooling fluid to exit the fluid channel. The fluid channel 150 is configured to internally circulate the cooling fluid for carrying heat dissipated by an electrical component such as a CPU. The cover 101 is coupled to the base portion 102 such that the fluid channel 150 is enclosed internally in the cold plate 100. In some embodiments, the cover 101 is detachably coupled to the base portion 102. In some embodiments, a bottom side of the cover 101 has a flat surface. The cover 101 has a vapor outlet 130 formed on a top side of the cover, and the vapor outlet allows generated vapor to exit from within the cold plate 100. In some embodiments, the vapor outlet 130 extends from the top side of the cover 101. In some embodiments the fluid inlet 110 and the fluid outlet 120 extend from sides of the base portion 102. However, in some embodiments, at least one or all of the fluid inlet 110, fluid outlet 120, and vapor outlet 130 are not formed extendingly.

Referring to FIG. 3A, the base portion 102 is defined by a peripheral wall or outer wall 102-1, the fluid channel 150 being located adjacent to the peripheral wall. The peripheral wall 102-1 has a plurality of sides, including a front side, a back side, a left side, and a right side. The base portion 102 further includes a chamber 140, and the fluid channel 150 is located between the peripheral wall 102-1 and the chamber 140 defined by an inner wall 102-2. The fluid channel 150 completely surrounds the chamber 140.

Figure 4A:
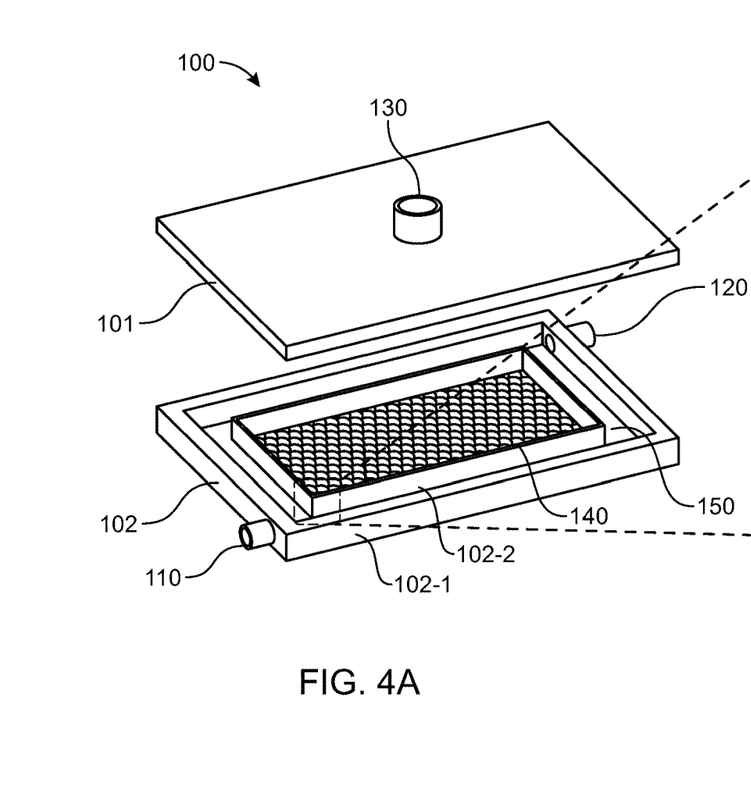
FIG. 4A is a generally perspective view of a cold plate with a gap separating a fluid channel from a chamber and FIG. 4B is an enlarged view of a portion indicated by a box in FIG. 4A, the enlarged view showing a gap, according to certain aspects of the present disclosure.

Referring to FIG. 4A, inside the base portion 102, there is a chamber 140 located at the top side of the heat source. The surface of the chamber 140 is covered with a layer 160 of a control material. In some embodiments, any material with a micro-structure that creates sufficient capillary force is used as the control material. For example, the control material includes a wick material, a powder material, or both. In some embodiments, the thickness of the layer 160 is controlled or determined based on the defined amount of heat power. That is, if the amount of heat generated by the heat source is greater, the thickness of the layer 160 should be increased compared to when the amount of heat is less. The chamber 140 is surrounded by the fluid channel 150 filled with a cooling fluid.

Figure 4B:
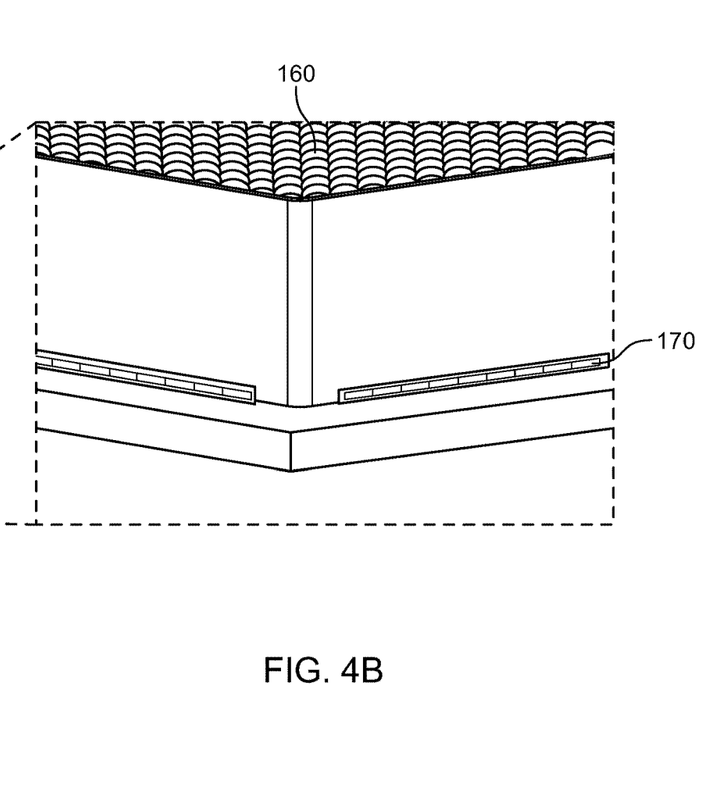

Referring to FIG. 4A and FIG. 4B, in some embodiments, the fluid channel 150 is separated from the chamber 140 via a controlled gap 170. In some embodiments, the control material is located in the controlled gap 170 such that the cooling fluid seeps through the control material from the fluid channel 150 to the chamber 140. Based on the amount of heat generated by the heat source, the gap 170 of the cold plate 100 may be smaller or greater because less or more vapor will be generated in the chamber 140 based on the amount of heat. That is, the size of the gap 170 may affect the amount of the cooling fluid seeped into the chamber 140, and also affect the amount of the vapor generated from within the chamber.

In some embodiments, the fluid or coolant in the fluid channel 150 is at a saturated temperature. In some embodiments, the height of the controlled gap 170 is defined to be smaller than the height of the layer 160 of the control material including the wick and/or powder material to ensure that the layer is always wet, but not submersed in the cooling fluid. That is, the layer 160 of the control material is never in a submerged state due to the height difference between the layer and the controlled gap 170.

Figure 5A:
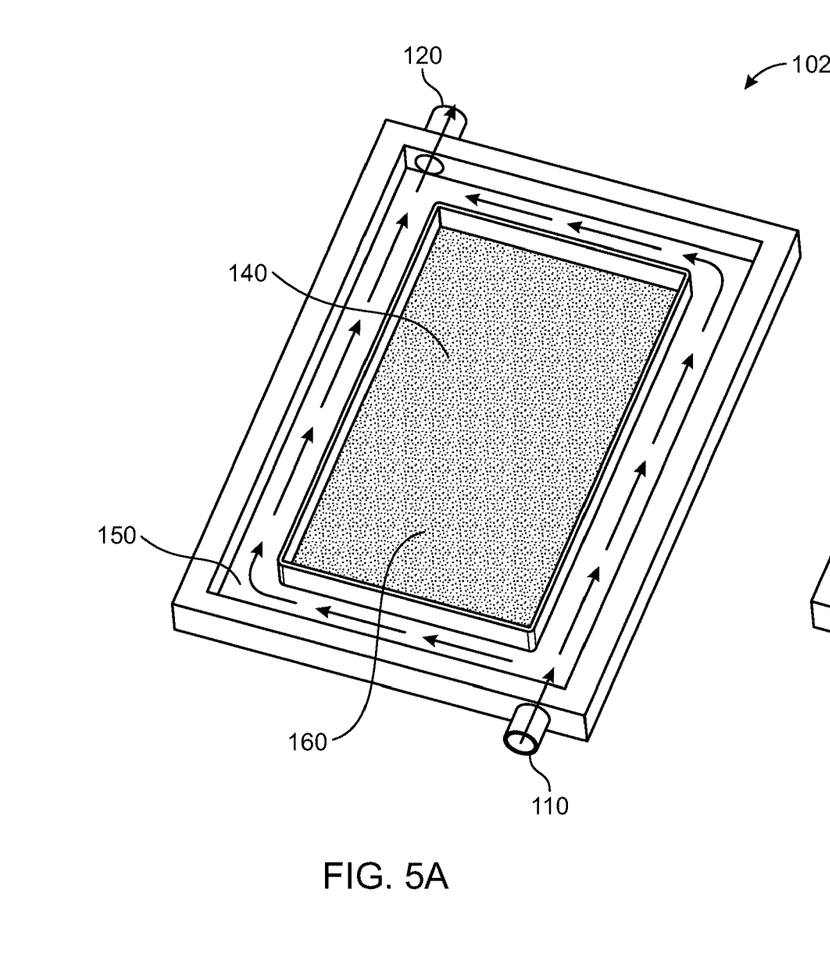
FIG. 5A is a generally perspective view of a base portion of a cold plate showing circulation of a cooling fluid in a fluid channel and FIG. 5B is the base portion shown in FIG. 5A in which the cooling fluid is sipped from the fluid channel to a chamber through a gap, according to certain aspects of the present disclosure.
Figure 5B:
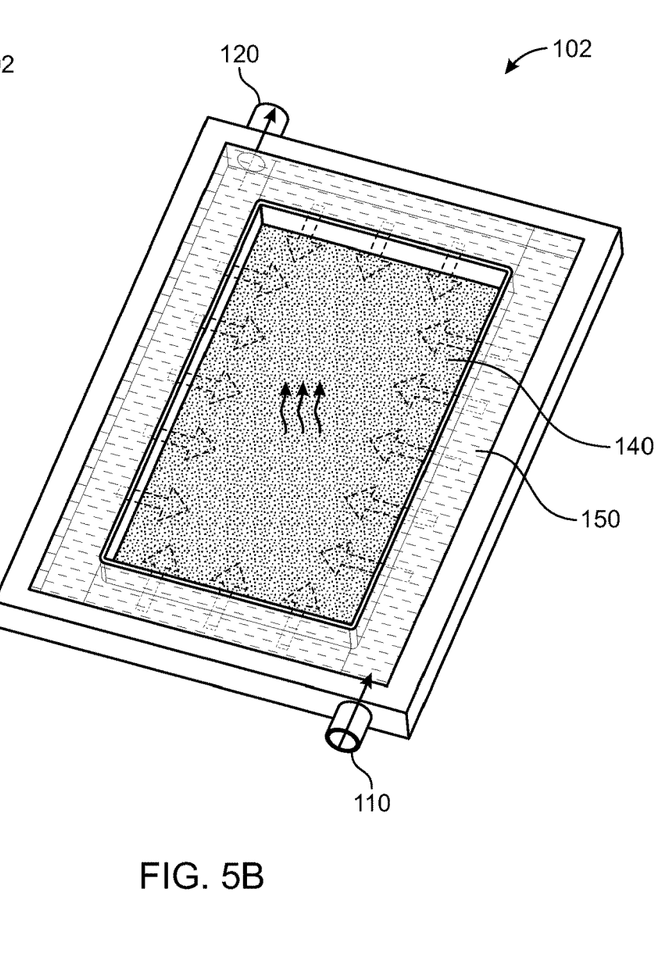

Referring to FIG. 5A, according to some embodiments of the present disclosure, a method for cooling an electronic component via a cold plate 100 includes circulating a cooling fluid in a fluid channel 150 of the cold plate, the fluid channel surrounding a peripheral surface of the cold plate. Referring to FIG. 5B, due to the capillary action, some fluid of the cooling fluid seeps from the fluid channel 150 into an internal chamber 140, the seeping being achieved through a control material located in the gap 170 between the fluid channel and the internal chamber shown in FIGS. 4A and 4B. Vapor generated from the cooling fluid by heat from the electronic component coupled to the cold plate 100 is expelled through a dedicated vapor outlet 130 located in a top surface of the cold plate. In some embodiments, the method for cooling the electronic component via the cold plate 100 further includes maintaining the control material located in the internal chamber 140 in a wet state such that a portion of the cooling fluid vaporized is supplemented or replaced with a portion of the cooling fluid provided from the fluid channel 150 by the seeping. Thus, an amount of the cooling fluid in the internal chamber is maintained at a substantially constant level.

According to various aspects of the present disclosure, the cold plate 100 achieves the following effects. During the heating process caused by the heat source such as an electronic component like CPU, there is no air bubble generated because cooling is achieved by keeping the wick and/or powder layer 160 sufficiently wet and the phase change matter (i.e. vapor) directly floats onto the top side, the vapor escaping through the vapor outlet 130. In some embodiments, the expelled vapor is directed to a condenser. Vaporized fluid will be immediately supplemented or replaced with the saturated cooling fluid provided from a fluid channel 150 due to capillary effect. Thus, the layer 160 in the chamber 140 is always kept in a wet state.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

One or more elements or aspects or steps, or any portion(s) thereof, from one or more of any of claims below can be combined with one or more elements or aspects or steps, or any portion(s) thereof, from one or more of any of the other claims or combinations thereof, to form one or more additional implementations and/or claims of the present disclosure.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cold plate for cooling an electronic component, the cold plate comprising:
    a base portion having a fluid channel with a fluid inlet and a fluid outlet, the fluid channel being configured to internally circulate a cooling fluid for carrying heat dissipated by the electrical component; and
    a cover coupled to the base portion such that the fluid channel is enclosed internally in the cold plate, the cover having a vapor outlet formed on a top side of the cover, the vapor outlet allowing generated vapor to exit from within the cold plate,
    wherein the base portion is defined by a peripheral wall, the fluid channel being located adjacent to the peripheral wall,
    wherein the base portion further includes a chamber, the fluid channel being located between the peripheral wall and the chamber, and
    wherein the fluid channel completely surrounds the chamber.

2. The cold plate of claim 1, wherein the peripheral wall has a plurality of sides, including a front side, a back side, a left side, and a right side.

3. The cold plate of claim 1, wherein the fluid channel is separated from the chamber via a controlled gap.

4. The cold plate of claim 3, further comprising a control material located in the controlled gap, the cooling fluid seeping through the control material from the fluid channel to the chamber.

5. The cold plate of claim 4, wherein the control material is a material with a micro-structure that creates sufficient capillary force, the control material comprising one or more of a wick material, a powder material.

6. A cold plate for cooling an electronic component, the cold plate comprising:
    a first member defined by a first wall;
    a second member mechanically coupled to the first member, the second member being defined by a second wall and a third wall, a fluid channel formed between the second wall and the third wall, the fluid channel being configured to internally circulate a cooling fluid for carrying heat dissipated by the electrical component;
    a chamber defined by the third wall, the fluid channel completely surrounding the chamber;
    a fluid inlet and a fluid outlet formed at the fluid channel, the fluid inlet formed at one end of the fluid channel for allowing the cooling fluid to enter the fluid channel, the fluid outlet formed at another end of the fluid channel for allowing the cooling fluid to exit the fluid channel; and
    a vapor outlet formed on a top side of the first member, the vapor outlet allowing generated vapor to exit from within the cold plate.

7. The cold plate of claim 6, wherein a surface of the chamber is covered with a layer of one or more of a material with a micro-structure that creates sufficient capillary force.

8. The cold plate of claim 7, wherein the fluid channel is separated from the chamber via a controlled gap, the controlled gap allowing the cooling fluid to seep through the one or more of the material with a micro-structure from the fluid channel into the chamber.

9. The cold plate of claim 8, wherein:
    the one or more of the material with a micro-structure comprises one or more of a wick material or a powder material; and
    a height of the controlled gap is less than a height of the layer of one or more of the material with a micro-structure such that the layer is always in a wet condition.

10. The cold plate of claim 8, wherein a portion of the cooling fluid vaporized from the chamber, and exiting from the cold plate, is replaced with a portion of the cooling fluid provided from the fluid channel by the seeping.

11. The cold plate of claim 6, wherein the vapor outlet extends from the top side of the first member.

12. The cold plate of claim 6, wherein an entire surface of a bottom side of the first member is flat.

13. The cold plate of claim 6, wherein the second member is detachably coupled to the first member.

14. A method for cooling an electronic component via a cold plate, the method comprising:
    circulating a cooling fluid in a fluid channel of the cold plate, the fluid channel surrounding a peripheral surface of the cold plate;
    allowing some fluid of the cooling fluid to seep from the fluid channel into an internal chamber, the seeping being achieved through a control material located in a gap between the fluid channel and the internal chamber; and
    causing vapor to be expelled through a dedicated vapor outlet located in a top surface of the cold plate, the vapor being generated by heat from the electronic component coupled to the cold plate,
    wherein the cold plate comprises:
        a base portion defined by a peripheral wall and having the fluid channel with a fluid inlet and a fluid outlet, the fluid channel being located adjacent to the peripheral wall; and a cover coupled to the base portion such that the fluid channel is enclosed internally in the cold plate, the cover having the vapor outlet on a top side of the cover, and wherein the base portion further includes the internal chamber, the fluid channel being located between the peripheral wall and the internal chamber, and the fluid channel completely surrounding the internal chamber.

15. The method of claim 14, further comprising maintaining the control material located in the internal chamber in a wet state, the wet state allowing vaporized cooling fluid to be supplemented with seeped cooling fluid.

16. The method of claim 15, wherein the cooling fluid within the internal chamber is maintained at a substantially constant level.

* * * * *